United States Patent
Chu et al.

(10) Patent No.: US 11,569,813 B2
(45) Date of Patent: Jan. 31, 2023

(54) USB SIGNAL OUTPUT CIRCUIT AND OPERATION METHOD THEREOF HAVING REVERSE CURRENT PREVENTION MECHANISM

(71) Applicant: REALTEK SEMICONDUCTOR CORPORATION, Hsinchu (TW)

(72) Inventors: Li-Cheng Chu, Hsinchu (TW); Leaf Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 187 days.

(21) Appl. No.: 17/206,175

(22) Filed: Mar. 19, 2021

(65) Prior Publication Data
US 2021/0297076 A1    Sep. 23, 2021

(30) Foreign Application Priority Data
Mar. 23, 2020  (TW) .................................. 109109653

(51) Int. Cl.
  *H02H 9/00*      (2006.01)
  *H03K 17/687*    (2006.01)
  (Continued)

(52) U.S. Cl.
  CPC ........... *H03K 17/687* (2013.01); *G06F 1/266* (2013.01); *G06F 13/4072* (2013.01);
  (Continued)

(58) Field of Classification Search
  None
  See application file for complete search history.

(56) References Cited

U.S. PATENT DOCUMENTS 5,877,634 A * 3/1999 Hunley ............ H03K 19/00361
326/83
7,706,112 B2  4/2010 Crawley et al.
(Continued)

FOREIGN PATENT DOCUMENTS

CN    101969192 A    2/2011

OTHER PUBLICATIONS

OA letter of the counterpart TW application (appl. No. 109109053) mailed on Oct. 15, 2020. Summary of the OA letter: 1. Fig. 1 includes two switch circuits 110 and one of them needs to be modify as passive-component low-pass filter circuit 180. 2. Claims 1, 7-8 and 10 are rejected as being unpatentable over the disclosure of the cited reference 1 (US 20190319447 A1), the cited reference 2 (CN 101969192 A) and the cited reference 3(U.S. Pat. No. 7706112 B2). 3. Claims 2-6 and 9 are allowable.

*Primary Examiner* — Stephen W Jackson
(74) *Attorney, Agent, or Firm* — WPAT, PC

(57) ABSTRACT

The present invention discloses a USB signal output circuit having reverse current prevention mechanism. A switch circuit turns on when a switch control terminal receives a first high level voltage to output a signal from a signal input terminal to a signal output terminal. A first voltage pull-low circuit includes a passive-component high-pass filter circuit and a discharging circuit. The passive-component high-pass filter circuit couples an output terminal voltage of the signal output terminal to a pull-low control terminal. The discharging circuit turns on when a voltage of the pull-low control terminal is larger than a predetermined voltage level to discharge the switch control terminal to pull the switch control terminal to a second high level voltage. A second voltage pull-low circuit pulls the switch control terminal to a low level voltage when the output terminal voltage is larger than a reference voltage and does not have a glitch.

18 Claims, 3 Drawing Sheets

(51) Int. Cl.
*G06F 13/42* (2006.01)
*G06F 13/40* (2006.01)
*H02H 7/22* (2006.01)
*G06F 1/26* (2006.01)
*H02H 3/18* (2006.01)

(52) U.S. Cl.
CPC ........... *G06F 13/4282* (2013.01); *H02H 3/18* (2013.01); *H02H 7/22* (2013.01); *G06F 2213/0042* (2013.01)

(56) References Cited

U.S. PATENT DOCUMENTS

| | | | |
|---|---|---|---|
| 11,100,034 B1* | 8/2021 | Vispute | G06F 1/266 |
| 2015/0048880 A1* | 2/2015 | Liu | H03K 5/1252 327/551 |
| 2019/0319447 A1 | 10/2019 | Mukhopadhyay et al. | |
| 2020/0119726 A1* | 4/2020 | Malakar | H03K 17/04163 |

\* cited by examiner

USB SIGNAL OUTPUT CIRCUIT AND OPERATION METHOD THEREOF HAVING REVERSE CURRENT PREVENTION MECHANISM

BACKGROUND OF THE INVENTION

1. Field of the Invention

The present invention relates to a USB signal output circuit and an operation method thereof having reverse current prevention mechanism.

2. Description of Related Art

Universal serial bus (USB) is a serial port transmission standard configured to connect a computer system and external devices, and serves as a technology standard of input and output interface. In recent years, USB Type-C technology becomes prominent since it enhances ease of use by being plug-able in either directions between host and devices, has improved transmission speed and supports higher charging power that results in faster charging speed.

Although USB Type-C cable is plug-able in either directions, a user may still accidentally plug the cable to a position causing a signal output circuit coming into contact with a pin that has a higher voltage. Under such a condition, if no quick response mechanism is available, the high voltage may cause a large reverse current that damages the signal output circuit or other circuits related to the signal output circuit.

SUMMARY OF THE INVENTION

In consideration of the problem of the prior art, an object of the present invention is to provide a USB signal output circuit and an operation method thereof having reverse current prevention mechanism.

The present invention discloses a USB signal output circuit having reverse current prevention mechanism that includes a switch circuit, a first voltage pull-low circuit and a second voltage pull-low circuit. The switch circuit includes a switch control terminal and is configured to turn on when the switch control terminal receives a first high level voltage, to perform signal output from a signal input terminal to a signal output terminal. The first voltage pull-low circuit includes a passive-component high-pass filter circuit and a discharging circuit. The passive-component high-pass filter circuit is configured to couple an output terminal voltage of the signal output terminal to a pull-low control terminal. The discharging circuit is configured to turn on when a voltage of the pull-low control terminal is larger than a predetermined voltage level, to discharge the switch control terminal such that the switch control terminal is pulled to a second high level voltage that is smaller than the first high level voltage. The second voltage pull-low circuit is configured to compare the output terminal voltage and a reference voltage and determine whether the output terminal voltage has a glitch, wherein the second voltage pull-low circuit pulls the switch control terminal to a low level voltage when the output terminal voltage is larger than the reference voltage and does not have the glitch.

The present invention also discloses a USB signal output circuit operation method having reverse current prevention mechanism used in a USB signal output circuit that includes the steps outlined below. A switch circuit that includes a switch control terminal turns on when the switch control terminal receives a first high level voltage, to perform signal output from a signal input terminal to a signal output terminal. An output terminal voltage of the signal output terminal is coupled to a pull-low control terminal by a passive-component high-pass filter circuit of a first voltage pull-low circuit. A discharging circuit of the first voltage pull-low circuit turns on when a voltage of the pull-low control terminal is larger than a predetermined voltage level, to discharge the switch control terminal such that the switch control terminal is pulled to a second high level voltage that is smaller than the first high level voltage. The output terminal voltage and a reference voltage are compared and whether the output terminal voltage has a glitch is determined by a second voltage pull-low circuit. The switch control terminal is pulled to a low level voltage by the second voltage pull-low circuit when the output terminal voltage is larger than the reference voltage and does not have the glitch.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a USB signal output circuit and an operation method thereof having reverse current prevention mechanism to quickly pull low a voltage of a switch control terminal when a voltage at a signal output terminal increases by disposing a first voltage pull-low circuit to prevent the occurrence of a reverse large current. A switch circuit of the USB signal output circuit is thus protected.

Figure 1:
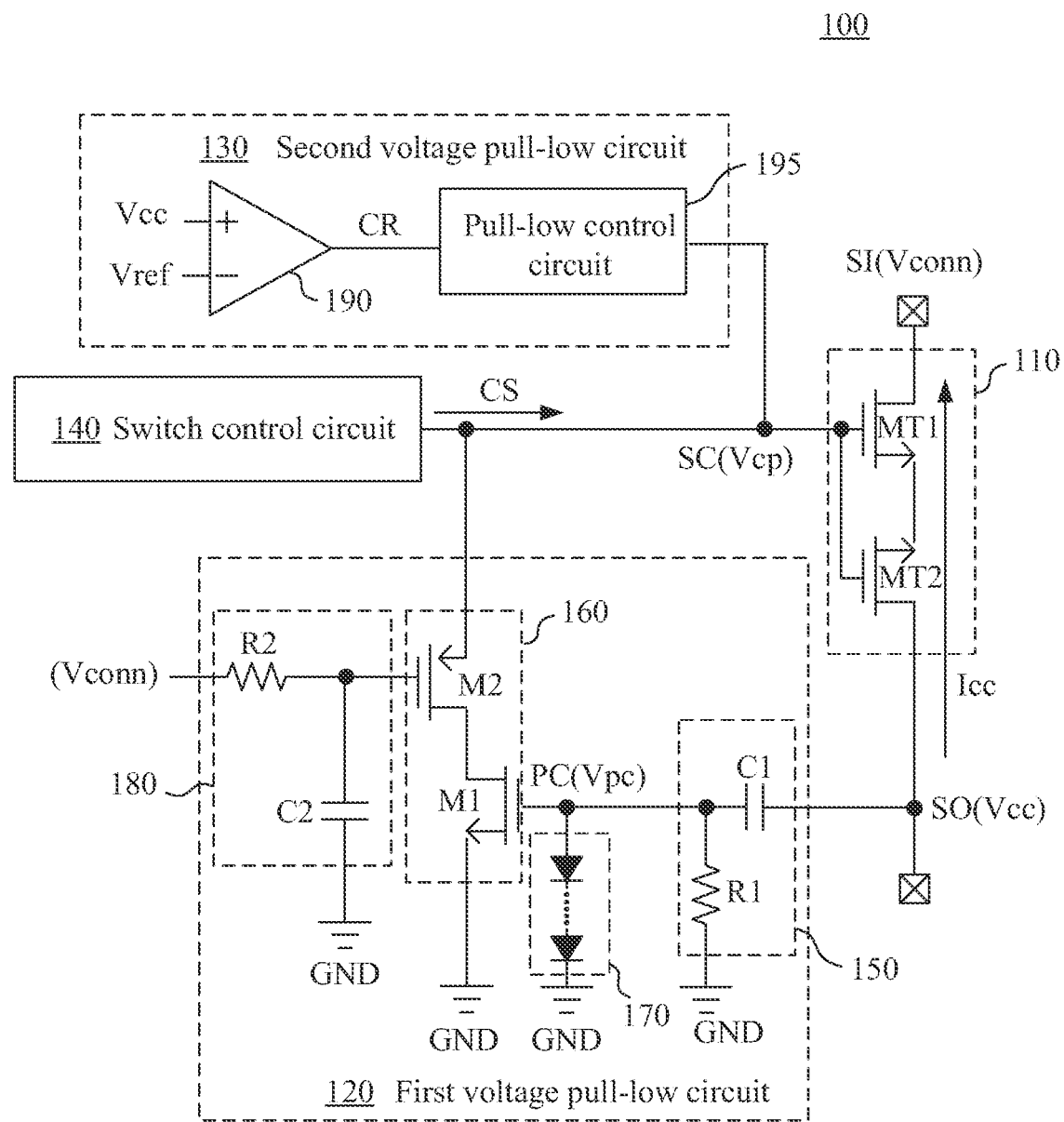
FIG. 1 illustrates a diagram of a USB signal output circuit having reverse current prevention mechanism according to an embodiment of the present invention.

Reference is now made to FIG. 1. FIG. 1 illustrates a diagram of a USB signal output circuit 100 having reverse current prevention mechanism according to an embodiment of the present invention.

The USB signal output circuit 100 can be disposed in an electronic device such that when the electronic device is electrically coupled to an external electronic device, a signal, e.g. a power signal or a data signal, can be outputted by using the USB signal output circuit 100. In an embodiment, the USB signal output circuit 100 has a format of USB type-C.

The USB signal output circuit 100 includes a switch circuit 110, a first voltage pull-low circuit 120 and a second voltage pull-low circuit 130.

In an embodiment, the switch circuit 110 includes a first NMOS transistor MT1 and a second NMOS transistor MT2. A gate of the first NMOS transistor MT1 is electrically coupled to a switch control terminal SC. A source of the first NMOS transistor MT1 is electrically coupled to a signal input terminal SI. A gate of the second NMOS transistor MT2 is electrically coupled to the switch control terminal SC. A source of the second NMOS transistor MT2 is electrically coupled to a signal output terminal SO. Drains of the first NMOS transistor MT1 and the second NMOS transistor MT2 are electrically coupled together.

In an embodiment, the USB signal output circuit 100 further includes a switch control circuit 140. The switch control terminal SC receives a control signal CS from the switch control circuit 140 to control the turn-on and turn-off of the switch circuit 110 according to a voltage status of the control signal CS.

More specifically, when the control signal CS is at a first high level voltage, a voltage Vcp of the switch control terminal SC receives such a high level voltage to drive the gates of the first NMOS transistor MT1 and the second NMOS transistor MT2, such that the switch circuit 110 turns on to perform signal output from the signal input terminal SI to the signal output terminal SO. When the control signal CS is at a low level voltage, the voltage Vcp at the switch control terminal SC becomes the low level voltage. The gates of the first NMOS transistor MT1 and the second NMOS transistor MT2 receive the low level voltage to turn off the first NMOS transistor MT1 and the second NMOS transistor MT2. As a result, the switch circuit 110 turns off.

In an embodiment, the first high level voltage outputted by the control signal CS can be such as, but not limited to 10 volts. The low level voltage can be such as, but not limited to 0 volt. The signal input terminal SI can be electrically coupled to a voltage source having an input terminal voltage Vconn of such as, but not limited to 5 volts. Due to the voltage drop caused by the turn-on status of the switch circuit 110, the output terminal voltage Vcc of the signal output terminal SO can be close to and slightly smaller than 5 volts.

In some usage scenarios, the user may contact the signal output terminal SO to other pins having high voltage due to improper operation. The output terminal voltage Vcc thus increases rapidly. Under such a condition, the first voltage pull-low circuit 120 provides a quick response mechanism to decrease the degree of the conduction of the switch circuit 110. A large reverse current generated according to the increased output terminal voltage Vcc that may damage the switch circuit 110 can be prevented.

The second voltage pull-low circuit 130 provides a slower response mechanism. The second voltage pull-low circuit 130 can determine whether the increased output terminal voltage Vcc is merely a glitch. When the increased output terminal voltage Vcc is not a glitch, the second voltage pull-low circuit 130 further turns off the switch circuit 110. When the increased output terminal voltage Vcc is a glitch, the second voltage pull-low circuit 130 restores the operation of the switch circuit 110.

Figure 2:
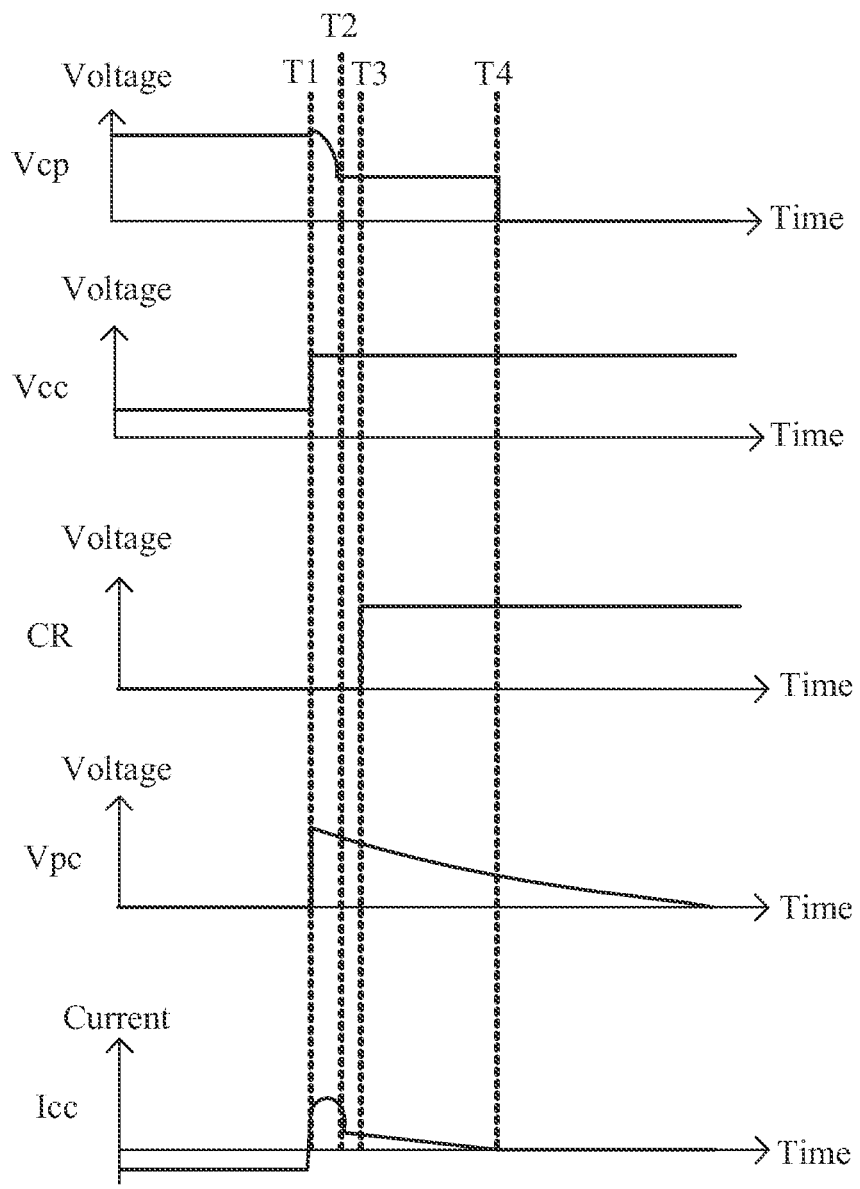
FIG. 2 illustrates a waveform diagram of voltages and currents of a multiple circuit nodes in the USB signal output circuit with respect to time according to an embodiment of the present invention.

Reference is now made to FIG. 2. FIG. 2 illustrates a waveform diagram of voltages and currents of a multiple circuit nodes in the USB signal output circuit 100 with respect to time according to an embodiment of the present invention.

The configuration and operation of the first voltage pull-low circuit 120 and the second voltage pull-low circuit 130 are described in accompany with FIG. 1 and FIG. 2.

The first voltage pull-low circuit 120 includes a passive-component high-pass filter circuit 150 and a discharging circuit 160.

The passive-component high-pass filter circuit 150 is configured to couple output terminal voltage Vcc of the signal output terminal SO to a pull-low control terminal PC. In an embodiment, the passive-component high-pass filter circuit 150 includes a capacitor C1 and a resistor R1. The capacitor C1 is electrically coupled between the signal output terminal SO and the pull-low control terminal PC. The resistor R1 is electrically coupled to the pull-low control terminal PC and a ground terminal GND.

Before a time spot T1 in FIG. 2, the switch circuit 110 operates in a normal turn-on status. As a result, the voltage Vcp of the switch control terminal SC is at the first high level voltage, which is 10 volts. The output terminal voltage Vcc of the signal output terminal SO is kept at around 5 volts. The voltage Vpc of the pull-low control terminal PC is at the low level voltage, which is 0 volt, due to the continuous discharging of the resistor R1.

At the time spot T1 in FIG. 2, a condition that the signal output terminal SO contacts a high voltage occurs such that the output terminal voltage Vcc rapidly increase to a level of such as, but not limited to 24 volts. Since the passive-component high-pass filter circuit 150 has a quick response time, the passive-component high-pass filter circuit 150 can couple the increased output terminal voltage Vcc to the pull-low control terminal PC at a time spot that is almost equal to the time spot T1.

In an embodiment, the USB signal output circuit 100 may include a diode circuit 170 electrically coupled to the pull-low control terminal PC and the ground terminal GND, to limit a voltage of the pull-low control terminal PC below a maximum value, such as, but not limited 5 volts. Such a limitation guarantees that the voltage Vpc of the pull-low control terminal PC is not directly affected by an over-high voltage, to further provide a protection mechanism to the discharging circuit 160 that receives the voltage Vpc subsequently. In different embodiments, the diode circuit 170 may include different numbers of diodes depending on practical requirements to provide different amounts of voltage limitation.

The discharging circuit 160 is configured to turn on when the voltage Vpc of the pull-low control terminal PC is larger than a predetermined voltage level, to discharge the switch control terminal SC such that the switch control terminal SC is pulled to a second high level voltage that is smaller than the first high level voltage. In an embodiment, the discharging circuit 160 includes an NMOS transistor M1 and a PMOS transistor M2.

A gate of the NMOS transistor M1 is electrically coupled to the pull-low control terminal PC. A source of the NMOS transistor M1 is electrically coupled to the ground terminal GND. A gate of the PMOS transistor M2 receives a driving voltage that is smaller than the first high level voltage. In an embodiment, the gate of the PMOS transistor M2 can also be coupled to the voltage source having the input terminal voltage Vconn, such that the driving voltage is equal to the input terminal voltage Vconn. For convenience, the driving voltage is directly labeled as Vconn in FIG. 2.

A drain of the PMOS transistor M2 is electrically coupled to a drain of the NMOS transistor M1. A source of the PMOS transistor M2 is electrically coupled to the switch control terminal SC.

Before the time spot T1 in FIG. 2, since the voltage Vpc of the pull-low control terminal PC is the low level voltage, the NMOS transistor M1 turns off. The source of the PMOS transistor M2 receives the voltage Vcp of the switch control terminal SC, which is the first high level voltage. The gate of the PMOS transistor M2 receives the driving voltage. The voltage difference between the source and the gate thereof supposes to keep the PMOS transistor M2 turning on.

However, since the turn-off of the NMOS transistor M1 forces the voltage of the drain of the PMOS transistor M2 to increase to be equal to the driving voltage, the PMOS transistor M2 turns off as well to guarantee that the cross voltage between the drain and the source of the NMOS transistor M1 is not too large so as to cause damage to the NMOS transistor M1.

At the time spot T1 in FIG. 2, the voltage Vpc of the pull-low control terminal PC increases due to the voltage coupling of the passive-component high-pass filter circuit 150. The NMOS transistor M1 thus turns on to further pull low the voltage of the drains of the NMOS transistor M1 and the PMOS transistor M2. The PMOS transistor M2 starts to turn on to discharge the switch control terminal SC. The voltage Vcp thereof starts to decrease.

At the time spot T2 in FIG. 2, when the voltage Vcp of the switch control terminal SC drops to a voltage level that is close to a sum of the driving voltage received by the gate of the PMOS transistor M2 and a threshold voltage of the PMOS transistor M2, the PMOS transistor M2 is not able to turn on. As a result, after the PMOS transistor M2 turns off, the voltage Vcp of the switch control terminal SC reaches the second high level voltage that is smaller than the first high level voltage. In an embodiment, the second high level voltage is around the sum of the driving voltage (such as, but not limited to 5 volts) and the threshold voltage of the PMOS transistor M2 (such as, but not limited to 1 volt), which is 6 volts.

By using the mechanism described above to discharge the switch control terminal SC, the voltage Vcp that is the second high level voltage can greatly reduce the degree of the conduction of the first NMOS transistor MT1 and the second NMOS transistor MT2. The large reverse current can be prevented. As illustrated in FIG. 2, a reverse current Icc generated in the switch circuit 110 only has a tiny glitch between the time spot T1 and the time spot T2. Subsequently, the amount of the reverse current Icc drops to a pretty low level due to the mechanism described above.

In an embodiment, the USB signal output circuit 100 further includes a passive-component low-pass filter circuit 180. The gate of the PMOS transistor M2 actually receives the driving voltage through the passive-component low-pass filter circuit 180. In an embodiment, the passive-component low-pass filter circuit 180 includes a resistor R2 and a capacitor C2. The resistor R2 is electrically coupled between the voltage source of the driving voltage and the gate of the PMOS transistor M2. The capacitor C2 is electrically coupled between the gate of the PMOS transistor M2 and the ground terminal GND.

In the present embodiment, since the gate of the PMOS transistor M2 is electrically coupled to the voltage source having the input terminal voltage Vconn, when the condition that the signal output terminal SO contacts a high voltage occurs, the output terminal voltage Vcc that increases instantly may still make the input terminal voltage Vconn temporarily increase through the switch circuit 110 that is at the turn-on status. As a result, the passive-component low-pass filter circuit 180 makes the input terminal voltage Vconn couple to the gate of the PMOS transistor M2 slowly to avoid the damage of the PMOS transistor M2.

The second voltage pull-low circuit 130 includes a comparator circuit 190 and a pull-low control circuit 195.

At the time spot T3 in FIG. 2, the comparator circuit 190 compares the output terminal voltage Vcc and a reference voltage Vref to generate a comparison result CR. Since the comparator circuit 190 is an active circuit having a slower response time, the time spot T3 that the comparison result CR is generated is behind the time spot T1 that the passive-component high-pass filter circuit 150 couples the output terminal voltage Vcc to the pull-low control terminal PC.

According to the comparison result CR, the pull-low control circuit 195 determines whether the output terminal voltage Vcc is larger than the reference voltage Vref and determines whether the output terminal voltage Vcc has a glitch. In an embodiment, the occurrence of the glitch can be defined as the condition that the output terminal voltage Vcc exceeds a predetermined voltage level within a predetermined range of time occurs.

At the time spot T4 in FIG. 2, when the output terminal voltage Vcc is larger than the reference voltage Vref and does not have the glitch, the pull-low control circuit 195 can pull low the voltage Vcp of the switch control terminal SC to the low level voltage by using such as, but not limited to a discharging mechanism. In an embodiment, a glitch canceling interval from the time spot T3 that the comparison result CR is generated to the time spot T4 that the determination of the glitch is finished is such as, but not limited to 20 nanoseconds.

In an embodiment, by using a signal transmission (not illustrated), the pull-low control circuit 195 can control the switch control circuit 140 to stop outputting the control signal CS having the first high level voltage and start to output the low level voltage instead to further guarantee the turn-off of the switch circuit 110.

In an embodiment, the pull-low control circuit 195 may include a logic circuit used to perform determination and a discharging circuit used to perform discharging to implement the mechanism described above. The present invention is not limited a particular circuit configuration.

When the output terminal voltage Vcc, that is determined to be larger than the reference voltage Vref and is determined not to be the glitch, gradually decreases along with time, the voltage that the passive-component high-pass filter circuit 150 couples to the pull-low control terminal PC decreases, such that the NMOS transistor M1 turns off. The voltage of the drains of the NMOS transistor M1 and the PMOS transistor M2 thus increases to make the PMOS transistor M2 turn off. As a result, the discharging circuit 160 of the first voltage pull-low circuit 120 stops to turn on. Further, the pull-low control circuit 195 can determine that the output terminal voltage Vcc is not larger than the reference voltage Vref according to the comparison result CR from the comparator circuit 190, to stop pull low the voltage Vcp of the switch control terminal SC. The pull-low control circuit 195 further controls the switch control circuit 140 to restore operation to output the control signal CS having the first high level voltage. The degree of conduction of the switch circuit 110 restores and operate normally.

On the other hand, when the output terminal voltage Vcc is determined to be larger than the reference voltage Vref and has the glitch, the pull-low control circuit 195 does not perform the voltage pull-low mechanism and keeps the switch control circuit 140 outputting the control signal CS having the first high level voltage. Under such a condition, the discharging circuit 160 of the first voltage pull-low circuit 120 stops to turn on after the voltage of the glitch drops to a certain level. The voltage Vcp of the switch control terminal SC restores from the second high level voltage to the first high level voltage. The degree of conduction of the switch circuit 110 restores and operate normally.

As a result, in the USB signal output circuit of the present invention, by utilizing the first voltage pull-low circuit, the passive-component high-pass filter circuit can quickly respond to the increase of the signal output terminal and activate the discharging circuit to decrease the voltage of the switch control terminal to lower the degree of the conduction of the switch circuit to prevent the generation of the large reverse current. The second voltage pull-low circuit that responds more slowly provides the glitch determination mechanism to decide whether the switch circuit should be fully turned off. The switch circuit and other circuits related to the signal input terminal can be protected.

It is appreciated that the circuit configuration and the voltage values described above are merely an example. In other embodiments, other circuit configurations that can perform the same function and other voltage values can be used to implement the mechanism to prevent the occurrence of the reverse current. The present invention is not limited thereto.

Figure 3:
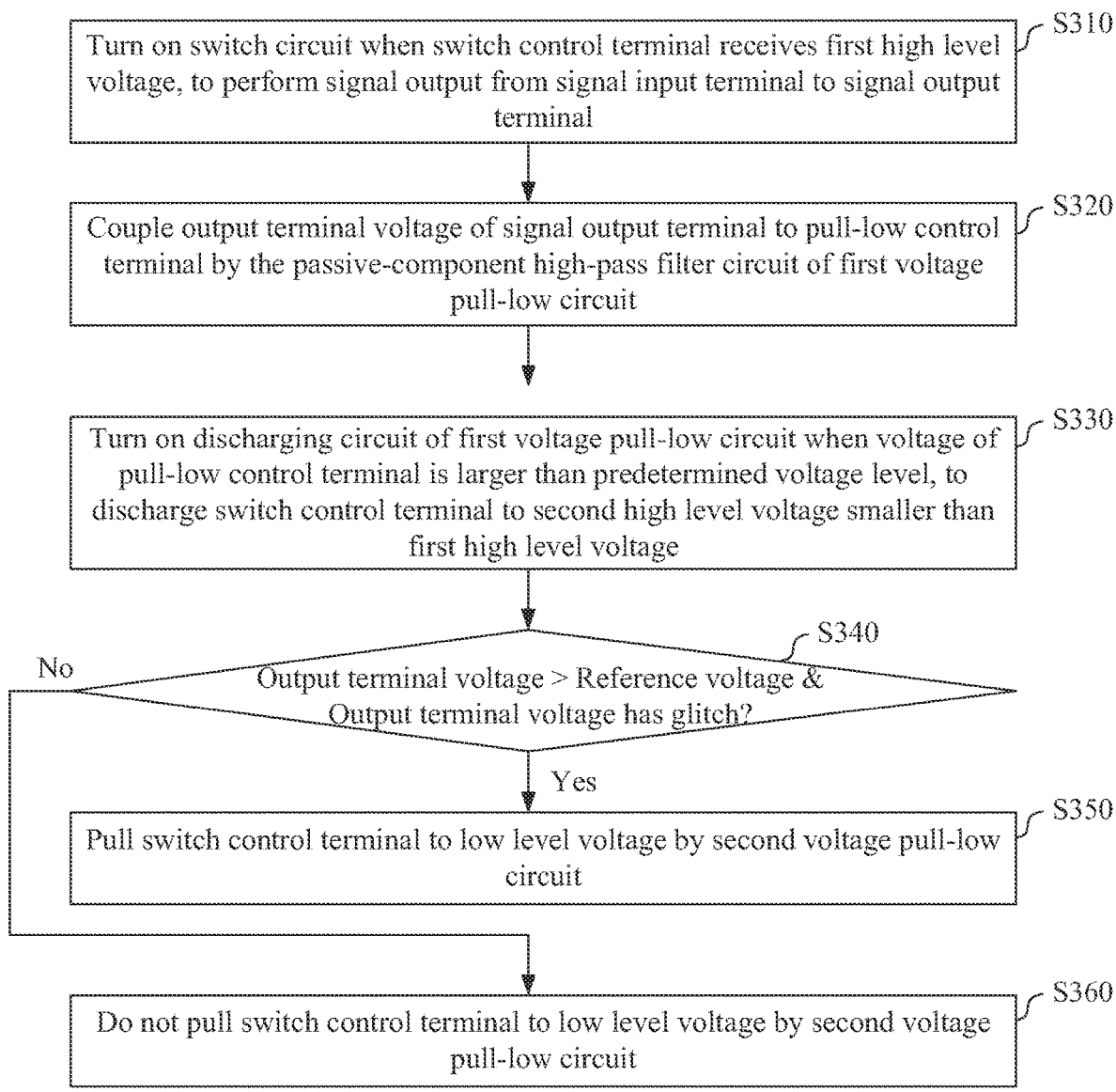
FIG. 3 illustrates a flow chart of a USB signal output circuit operation method having reverse current prevention mechanism according to an embodiment of the present invention.

Reference is now made to FIG. 3. FIG. 3 is a flow chart of a USB signal output circuit operation method 300 having reverse current prevention mechanism according to an embodiment of the present invention.

Besides the apparatus described above, the present invention further discloses the USB signal output circuit operation method 300 that can be used in such as, but not limited to the USB signal output circuit 100 illustrated in FIG. 1. An embodiment of the USB signal output circuit operation method 300 is illustrated in FIG. 3 and includes the steps outlined below.

In step S310, the switch circuit 100 turns on when the switch control terminal SC receives the first high level voltage, to perform signal output from the signal input terminal SI to the signal output terminal SO.

In step S320, the output terminal voltage Vcc of the signal output terminal SO is coupled to the pull-low control terminal PC by the passive-component high-pass filter circuit 150 of the first voltage pull-low circuit 120.

In step S330, the discharging circuit 160 of the first voltage pull-low circuit 120 turns on when the voltage of the pull-low control terminal PC is larger than the predetermined voltage level, to discharge the switch control terminal SC such that the switch control terminal SC is pulled to the second high level voltage that is smaller than the first high level voltage.

In step S340, the output terminal voltage Vcc and the reference voltage Vref are compared and whether the output terminal voltage Vcc has the glitch is determined by the second voltage pull-low circuit 130.

In step S350, the switch control terminal SC is pulled to the low level voltage by the second voltage pull-low circuit 130 when the output terminal voltage Vcc is larger than the reference voltage Vref and does not have the glitch.

In step S360, the switch control terminal SC is not pulled to the low level voltage by the second voltage pull-low circuit 130 when either the output terminal voltage Vcc is not larger than the reference voltage Vref or has the glitch.

It is appreciated that the embodiments described above are merely an example. In other embodiments, it should be appreciated that many modifications and changes may be made by those of ordinary skill in the art without departing, from the spirit of the invention.

In summary, the USB signal output circuit and the operation method thereof having reverse current prevention mechanism by disposing the first voltage pull-low circuit of the USB signal output circuit, can quickly decrease the voltage of the switch control terminal when the voltage of the signal output terminal increases to prevent the generation of the large reverse current. The switch circuit can be protected.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A circuit, comprising:
   a switch circuit comprising a switch control terminal, and configured to turn on when the switch control terminal receives a first high level voltage and to perform signal output to a signal output terminal according to an input signal from a signal input terminal;
   a first voltage pull-low circuit comprising:
      a passive-component high-pass filter circuit configured to couple an output terminal voltage of the signal output terminal to a pull-low control terminal; and
      a discharging circuit configured to turn on when a voltage of the pull-low control terminal is larger than a predetermined voltage level and to discharge the switch control terminal such that the switch control terminal is pulled to a second high level voltage that is smaller than the first high level voltage; and
   a second voltage pull-low circuit configured to compare the output terminal voltage and a reference voltage and determine whether the output terminal voltage has a glitch and configured to pull the switch control terminal to a low level voltage when the output terminal voltage is larger than the reference voltage and does not have the glitch.

2. The circuit of claim 1, further comprising a diode circuit electrically coupled to the pull-low control terminal and a ground terminal, and configured to limit the voltage of the pull-low control terminal below a maximum value.

3. The circuit of claim 1, wherein the discharging circuit further comprises:
   an NMOS transistor comprising a first gate, a first drain and a first source, wherein the first gate is electrically coupled to the pull-low control terminal and the first source is electrically coupled to a ground terminal; and
   a PMOS transistor comprising a second gate, a second drain and a second source, wherein the second gate is configured to receive a driving voltage smaller than the first high level voltage, the second drain is electrically coupled to the first drain and the second source is electrically coupled to the switch control terminal.

4. The circuit of claim 3, wherein when the NMOS transistor turns on, the PMOS transistor turns on according to a voltage difference between the second source and the second gate, to pull the switch control terminal to the second high level voltage.

5. The circuit of claim 3, wherein when the NMOS transistor turns off and the PMOS transistor turns on, voltages of the first drain and the second drain increase to be equal to the driving voltage, such that the PMOS transistor turns off.

6. The circuit of claim 3, wherein the second gate of the PMOS transistor receives the driving voltage through a passive-component low-pass filter circuit.

7. The circuit of claim 1, wherein the second voltage pull-low circuit comprises:
   a comparator circuit configured to compare the output terminal voltage and the reference voltage to generate a comparison result; and
   a pull-low control circuit configured to determine whether the output terminal voltage is larger than the reference voltage according to the comparison result, and whether the output terminal voltage has the glitch;

wherein the pull-low control circuit is configured to pull the switch control terminal to the low level voltage when the output terminal voltage is larger than the reference voltage and does not have the glitch.

8. The circuit of claim 1, wherein the switch circuit comprises:
a first NMOS transistor comprising a third gate, a third drain and a third source, wherein the third gate is electrically coupled to the switch control terminal, and the third source is electrically coupled to the signal input terminal; and
a second NMOS transistor comprising a fourth gate, a fourth drain and a fourth source, wherein the fourth gate is electrically coupled to the switch control terminal, the fourth drain is electrically coupled to the third drain and the fourth source is electrically coupled to the signal output terminal.

9. The circuit of claim 1, further comprising a switch control circuit configured to output the first high level voltage to the switch control terminal, wherein the second voltage pull-low circuit further controls the switch control circuit to stop to output the first high level voltage when the output terminal voltage is larger than the reference voltage and does not have the glitch.

10. A method having reverse current prevention mechanism for a USB signal output circuit, comprising:
turning on a switch circuit comprising a switch control terminal when the switch control terminal receives a first high level voltage, to perform signal output to a signal output terminal according to an input signal from a signal input terminal;
coupling an output terminal voltage of the signal output terminal to a pull-low control terminal by a passive-component high-pass filter circuit of a first voltage pull-low circuit;
turning on a discharging circuit of the first voltage pull-low circuit when a voltage of the pull-low control terminal is larger than a predetermined voltage level, to discharge the switch control terminal such that the switch control terminal is pulled to a second high level voltage that is smaller than the first high level voltage;
comparing the output terminal voltage and a reference voltage and determining whether the output terminal voltage has a glitch by a second voltage pull-low circuit; and
pulling the switch control terminal to a low level voltage by the second voltage pull-low circuit when the output terminal voltage is larger than the reference voltage and does not have the glitch.

11. The method of claim 10, wherein the USB signal output circuit further comprises a diode circuit electrically coupled to the pull-low control terminal and a ground terminal, and configured to limit the voltage of the pull-low control terminal below a maximum value.

12. The method of claim 10, wherein the discharging circuit further comprises:

an NMOS transistor comprising a first gate, a first drain and a first source, wherein the first gate is electrically coupled to the pull-low control terminal and the first source is electrically coupled to a ground terminal; and
a PMOS transistor comprising a second gate, a second drain and a second source, wherein the second gate is configured to receive a driving voltage smaller than the first high level voltage, the second drain is electrically coupled to the first drain and the second source is electrically coupled to the switch control terminal.

13. The method of claim 12, further comprising:
when the NMOS transistor turns on, turning on the PMOS transistor according to a voltage difference between the second source and the second gate, to pull the switch control terminal to the second high level voltage.

14. The method of claim 12, further comprising:
when the NMOS transistor turns off and the PMOS transistor turns on, increasing voltages of the first drain and the second drain to be equal to the driving voltage, such that the PMOS transistor turns off.

15. The method of claim 12, wherein the second gate of the PMOS transistor receives the driving voltage through a passive-component low-pass filter circuit.

16. The method of claim 10, wherein the second voltage pull-low circuit comprises:
a comparator circuit configured to compare the output terminal voltage and the reference voltage to generate a comparison result; and
a pull-low control circuit configured to determine whether the output terminal voltage is larger than the reference voltage according to the comparison result, and whether the output terminal voltage has the glitch;
wherein the pull-low control circuit is configured to pull the switch control terminal to the low level voltage when the output terminal voltage is larger than the reference voltage and does not have the glitch.

17. The method of claim 10, wherein the switch circuit comprises:
a first NMOS transistor comprising a third gate, a third drain and a third source, wherein the third gate is electrically coupled to the switch control terminal, and the third source is electrically coupled to the signal input terminal; and
a second NMOS transistor comprising a fourth gate, a fourth drain and a fourth source, wherein the fourth gate is electrically coupled to the switch control terminal, the fourth drain is electrically coupled to the third drain and the fourth source is electrically coupled to the signal output terminal.

18. The method of claim 10, wherein the USB signal output circuit further comprises a switch control circuit, and the method further comprises:
outputting the first high level voltage to the switch control terminal by the switch control circuit; and
controlling the switch control circuit to stop to output the first high level voltage when the output terminal voltage is larger than the reference voltage and does not have the glitch by the second voltage pull-low circuit.

* * * * *